United States Patent
Seong et al.

(10) Patent No.: US 7,535,768 B2
(45) Date of Patent: May 19, 2009

(54) METHOD OF CONTROLLING COPY-BACK OPERATION OF FLASH MEMORY DEVICE INCLUDING MULTI-LEVEL CELLS

(75) Inventors: Jin Yong Seong, Seoul (KR); Sam Kyu Won, Icheon-si (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 0 days.

(21) Appl. No.: 11/907,551

(22) Filed: Oct. 15, 2007

(65) Prior Publication Data
US 2008/0068884 A1    Mar. 20, 2008

Related U.S. Application Data

(62) Division of application No. 11/416,070, filed on May 3, 2006, now Pat. No. 7,301,825.

(30) Foreign Application Priority Data
Jun. 14, 2005    (KR) ............................... 2005-50763

(51) Int. Cl.
*G11C 11/34* (2006.01)
(52) U.S. Cl. .................. 365/185.22; 365/185.03; 365/185.33; 365/189.05; 365/189.07; 365/189.08
(58) Field of Classification Search ............. 365/185.22, 365/185.03, 185.33, 189.05, 189.07, 189.08
See application file for complete search history.

(56) References Cited

U.S. PATENT DOCUMENTS

| 5,822,251 | A | 10/1998 | Bruce et al. |
| 6,000,006 | A | 12/1999 | Bruce et al. |
| 6,850,435 | B2 | 2/2005 | Tanaka |
| 6,885,583 | B2 | 4/2005 | Tanaka |
| 7,200,044 | B2 * | 4/2007 | Won et al. ............... 365/185.22 |
| 7,221,598 | B2 * | 5/2007 | Jeong ..................... 365/185.28 |
| 7,301,825 | B2 * | 11/2007 | Seong et al. .......... 365/189.011 |
| 7,333,365 | B2 * | 2/2008 | Seong ................... 365/185.12 |

FOREIGN PATENT DOCUMENTS

EP    000817079    6/2005

OTHER PUBLICATIONS

Office Action dated May 9, 2007 from the parent application.
Notice of Allowance dated Jul. 23, 2007 from the parent application.

* cited by examiner

*Primary Examiner*—Viet Q Nguyen
(74) *Attorney, Agent, or Firm*—Lowe Hauptman Ham & Berner, LLP

(57) ABSTRACT

A method of controlling a copy-back operation of a flash memory device including multi-level cells. In the method, the copy-back operation can be executed even without an additional storage space. Accordingly, a program time can be shortened and operational performance of a flash memory device can be improved.

14 Claims, 12 Drawing Sheets

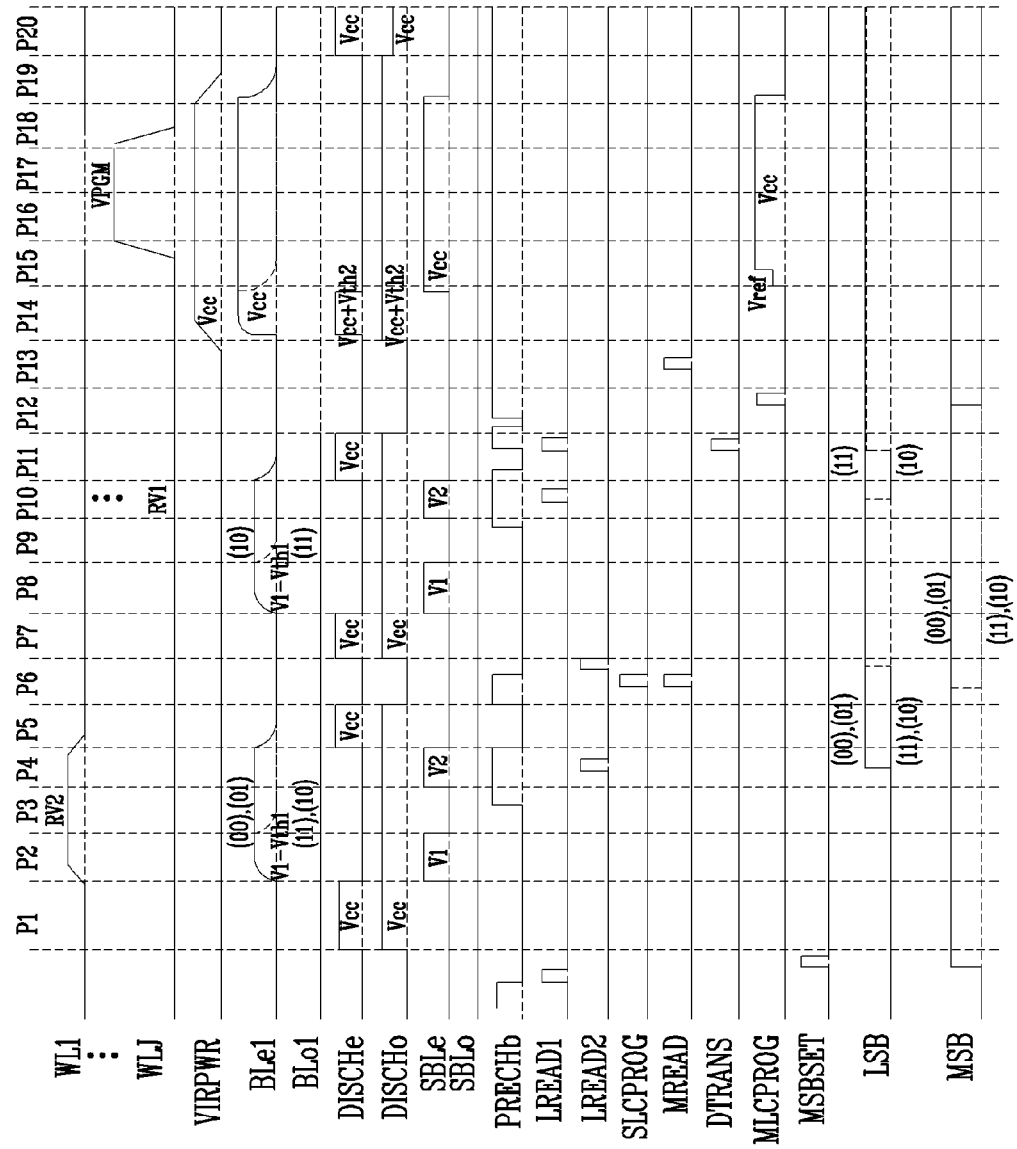

METHOD OF CONTROLLING COPY-BACK OPERATION OF FLASH MEMORY DEVICE INCLUDING MULTI-LEVEL CELLS

CROSS REFERENCE TO RELATED APPLICATION

This application is a divisional of U.S. Ser. No. 11/416,070, filed on May 3, 2006 now U.S. Pat. No. 7,301,825. This application, in its entirety, is incorporated herein by reference.

BACKGROUND

1. Field of the Invention

The present invention relates to flash memory devices, and more particularly, to a method of controlling a copy-back operation of a flash memory device.

2. Discussion of Related Art

In general, a flash memory device includes a page buffer for programming or reading a large quantity of data for a short period of time. Accordingly, the program or read operation of the flash memory device is executed by the page buffer on a page by page basis.

Recently, to further improve the degree of integration of the flash memory device, a flash memory device including Multi-Level Cells (MLCs) capable of storing plural bits of data has been developed. In general, since 2-bit data can be programmed into a MLC, one MLC can store any one of four data values, i.e., [11], [10], [00] and [01]. The MLC has a threshold voltage (one of Vt1 to Vt4) corresponding to the stored data (one of [11], [10], [00] and [01]).

A memory cell capable of storing single bit data is generally referred to as a Single Level Cell (SLC). A flash memory device including these SLCs basically supports the copy-back operation.

The copy-back operation includes storing data, which are stored in memory cells of a source page (i.e., one address), in a page buffer, and programming the stored data (without or with change) into memory cells of a target page (i.e., the other address). However, a flash memory device including the MLCs does not support the copy-back operation.

Accordingly, in the flash memory device including the MLCs, one method of copying data of a source page to a desired target page is to read the data from the source page, store the read data in a storage unit external to a flash memory chip and then program the stored data into the target page. Another method is to read the data from the source page, store the read data in a storage space within a chip and then program the stored data in the target page.

However, these methods are problematic in that they are ineffective since additional storage spaces other than the page buffer are required and a programming time of the target page is long. In addition, if the additional storage space is disposed within the flash memory device, a problem arises because the size of the flash memory device is increased.

SUMMARY OF THE INVENTION

An embodiment of the present invention relates to a method of controlling a copy-back operation of a flash memory device including MLCs, wherein a copy-back operation can be executed even without additional storage space, thereby reducing a program time and improving the operational performance of the flash memory device.

According to an embodiment of the present invention, there is provided a method of controlling a copy-back operation of a flash memory device including a plurality of MLCs connected to bit lines and word lines, including the steps of initializing a lower bit register in response to a first lower read control signal; sequentially reading first and second lower bit data from a source MLC of the plurality of MLCs by sequentially applying first and second read voltages to a word line to which the source MLC is connected, and storing program data in the lower bit register based on the first and second lower bit data; determining whether the program data will be modified; if it is determined that the program data will not be modified, firstly programming the program data into a target MLC of the plurality of MLCs in response to a first program control signal; if it is determined that the program data will be modified, storing the modified program data in the lower bit register; and secondly programming the modified program data in the target MLC in response to the first program control signal.

According to another embodiment of the present invention, there is provided a method of controlling a copy-back operation of a flash memory device including a plurality of MLCs connected to bit lines and word lines, including the steps of initializing an upper bit register in response to a reset control signal and initializing a lower bit register in response to a first lower read control signal; reading upper bit data from a source MLC of the plurality of MLCs by applying a first read voltage to a word line to which the source MLC is connected, and storing first upper sensing data in the upper bit register based on the read upper bit data; reading lower bit data from a target MLC of the plurality of MLCs by applying a second read voltage to a word line to which the target MLC is connected, and storing first lower program prohibit data in the lower bit register based on the read lower bit data and the first upper sensing data; generating program data based on the first upper sensing data and the first lower program prohibit data and storing the program data in the upper bit register; determining whether the program data will be modified; if it is determined that the program data will not be modified, generating first last program data based on the program data and the first lower program prohibit data, and firstly programming the first last program data into the target MLC; if it is determined that the program data will be modified, storing second lower program prohibit data in the lower bit register and storing modified program data in the upper bit register; and generating second last program data based on the modified program data and the second lower program prohibit data, and secondly programming the second last program data in the target MLC.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 14 is a timing diagram of signals related to the copy-back operation of the flash memory device shown in FIG. 7 according to an embodiment of the present invention.

DETAILED DESCRIPTION OF EMBODIMENTS

Figure 1:
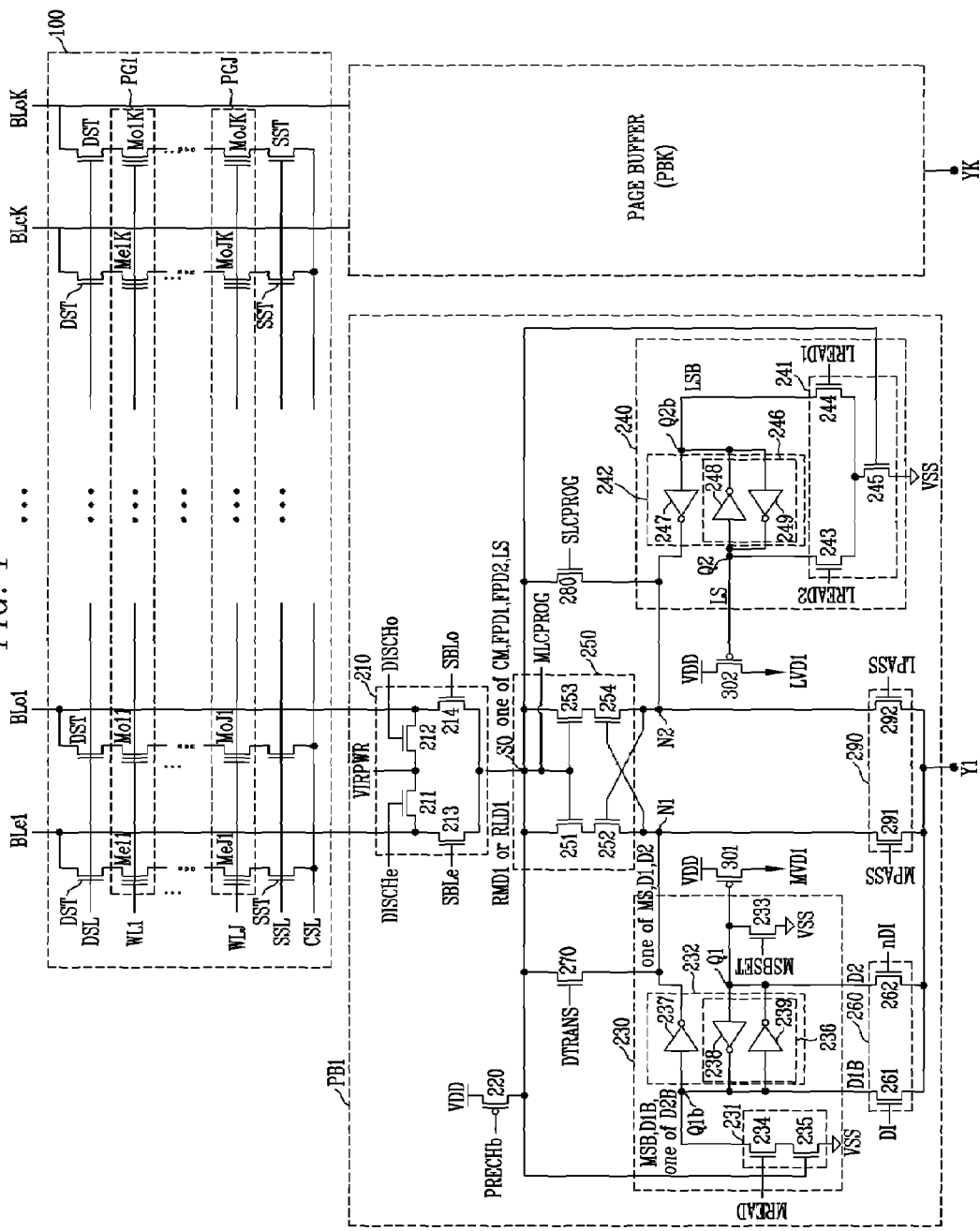
FIG. 1 is a circuit diagram of a memory cell array and page buffer circuits, for illustrating a method of controlling a copy-back operation of a flash memory device according to an embodiment of the present invention.

In the following detailed description, only certain exemplary embodiments of the present invention have been shown and described by way of illustration. As those skilled in the art will realize, the described embodiments may be modified in various different ways, all without departing from the spirit or scope of the present invention. Accordingly, the drawings and description are to be regarded as illustrative in nature and not restrictive. Like reference numerals designate like elements throughout.

FIG. 1 is a circuit diagram of a memory cell array and page buffer circuits, for illustrating a method of controlling a copy-back operation of a flash memory device according to an embodiment of the present invention.

Referring to FIG. 1, a memory cell array 100 includes MLCs (Me11 to MeJK), (Mo11 to MoJK) (J, K is integer) that share bit lines BLe1 to BLoK, BLo1 to BLoK (K is integer) and word lines WL1 to WLJ. The memory cell array 100 further includes drain select transistors DST connected to a drain select line DSL, and source select transistors SST connected to a source select line SSL.

In the memory cell array 100, MLCs (Me11 to Me1K, Mo11 to Mo1K) connected to the same word line (for example, WL1) form one page PG1. Each of a plurality of page buffers PB1 to PBK (K is integer) is connected to a pair of bit lines. For example, the page buffer PB1 may be connected to the bit lines BLe1, BLo1. The page buffers PB1 to PBK have substantially the same construction and operation. Therefore, only the page buffer PB1 will be described as an example.

The page buffer PB1 includes a bit line select circuit 210, a precharge circuit 220, an upper bit register 230, a lower bit register 240, a compare circuit 250, a data input circuit 260, a first switch 270, a second switch 280, a data output circuit 290 and verify circuits 301, 302.

The bit line select circuit 210 selects one of the bit lines BLe1, BLo1 in response to bit line select signals (SBLe, SBLo) and discharge signals (DISCHe, DISCHo), and connects the selected bit line BLe1 or BLo1 to a sensing node SO. The bit line select circuit 210 includes NMOS transistors 211 to 214. The operations of the NMOS transistors 211 to 214 are well known to those skilled in the art. Therefore, description thereof will be omitted.

The precharge circuit 220 precharges the sensing node SO with an internal voltage (VDD) in response to a precharge control signal (PRECHb).

The upper bit register 230 includes a sensing circuit 231, a latch circuit 232 and a latch reset circuit 233. The sensing circuit 231 includes NMOS transistors 234, 235. The sensing circuit 231 senses a voltage of the sensing node SO in response to an upper read control signal (MREAD) and generates upper sensing data (MSB) to a node Q1b. The latch circuit 232 includes a latch 236 and an inverter 237. The latch 236 latches the upper sensing data (MSB) generated in the node Q1b and outputs inversed upper sensing data (MS) to a node Q1.

Furthermore, the latch 236 latches input data (D1B or D2) and outputs inversed input data (D1 or D2B) to the node Q1 or Q1b. The inverter 237 receives the upper sensing data (MSB) or the input data (D1B or D2B) from the latch 236 through the node Q1b, inverts the received data (one of MSB, D1B and D2B) and outputs the inverted data to a node N1. The latch reset circuit 233 initializes the latch circuit 232 in response to a reset control signal (MSBSET).

The lower bit register 240 includes a sensing circuit 241 and a latch circuit 242. The sensing circuit 241 includes NMOS transistors 243 to 245. The sensing circuit 241 senses a voltage of the sensing node SO in response to a first or second lower read control signal (LREAD1 or LREAD2) and generates lower sensing data (LS or LSB) to a node Q2 or Q2b. The latch circuit 242 includes a latch 246 and an inverter 247. The latch 246 latches the lower sensing data (LS or LSB) and outputs the lower sensing data (LSB or LS) to the node Q2b or Q2. The inverter 247 receives the inversed lower sensing data (LSB) from the latch 246 through the node Q2b, inverts the received data (LSB) and outputs the inverted data to a node N2.

The compare circuit 250 includes NMOS transistors 251 to 254. The NMOS transistors 251, 252 are connected in series between the sensing node SO and the node N1. The NMOS transistors 253, 254 are connected between the sensing node SO and the node N2. The NMOS transistors 251, 253 are turned on or off in response to a program control signal (MLCPROG). The NMOS transistor 252 is turned on or off according to logic level of the lower sensing data (LS) received from the node N2. Furthermore, the NMOS transistor 254 is turned on or off according to logic level of data (one of MS, D1 and D2) received from the node N1. As a result, the compare circuit 250 compares the data (one of MS, D1 and D2) received through the nodes (N1, N2) and the lower sensing data (LS) when the program control signal (MLCPROG) is enabled and outputs the resulting compared data (one of CM, FPD1 and FPD2) to the sensing node SO according to the comparison result. A detailed operation of the compare circuit 250 is well known to those skilled in the art. Therefore, description thereof will be omitted.

The data input circuit 260 includes NMOS transistors 261, 262. The data input circuit 260 outputs the input data (D1B or D2), which are received through a data I/O node Y1, to the latch 236 of the upper bit register 230 through the node Q1*b* or Q1 in response to data input signals (DI, nDI).

Each of the first switch 270 and the second switch 280 may be implemented using a NMOS transistor. The first switch 270 is turned on or off in response to a data transfer signal (DTRANS). The second switch 280 is turned on or off in response to a program control signal (SLCPROG).

The data output circuit 290 includes NMOS transistors 291, 292. The NMOS transistor 291 is turned on or off in response to a data output signal (MPASS). The NMOS transistor 291 outputs the upper sensing data (MS), which are received from the node Q1, to the data I/O node Y1 when being turned on. The NMOS transistor 292 is turned on or off in response to a data output signal (LPASS). The NMOS transistor 292 outputs the lower sensing data (LS), which are received from the node Q2, to the data I/O node Y1 when being turned on.

A copy-back operation of the flash memory device constructed above according to an embodiment of the present invention will be described in detail with reference to FIGS. 2 to 6.

For convenience of description, in the present embodiment, an example in which data stored in the MLCs (Me11 to Me1K) (i.e., source MLCs) of the page PG1 are copy-back programmed into the MLCs (MeJ1 to MeJK) (i.e., target MLCs) of the page PGJ will be described. Furthermore, only the operation of the page buffer PB1 will be described as an example.

Figure 2:
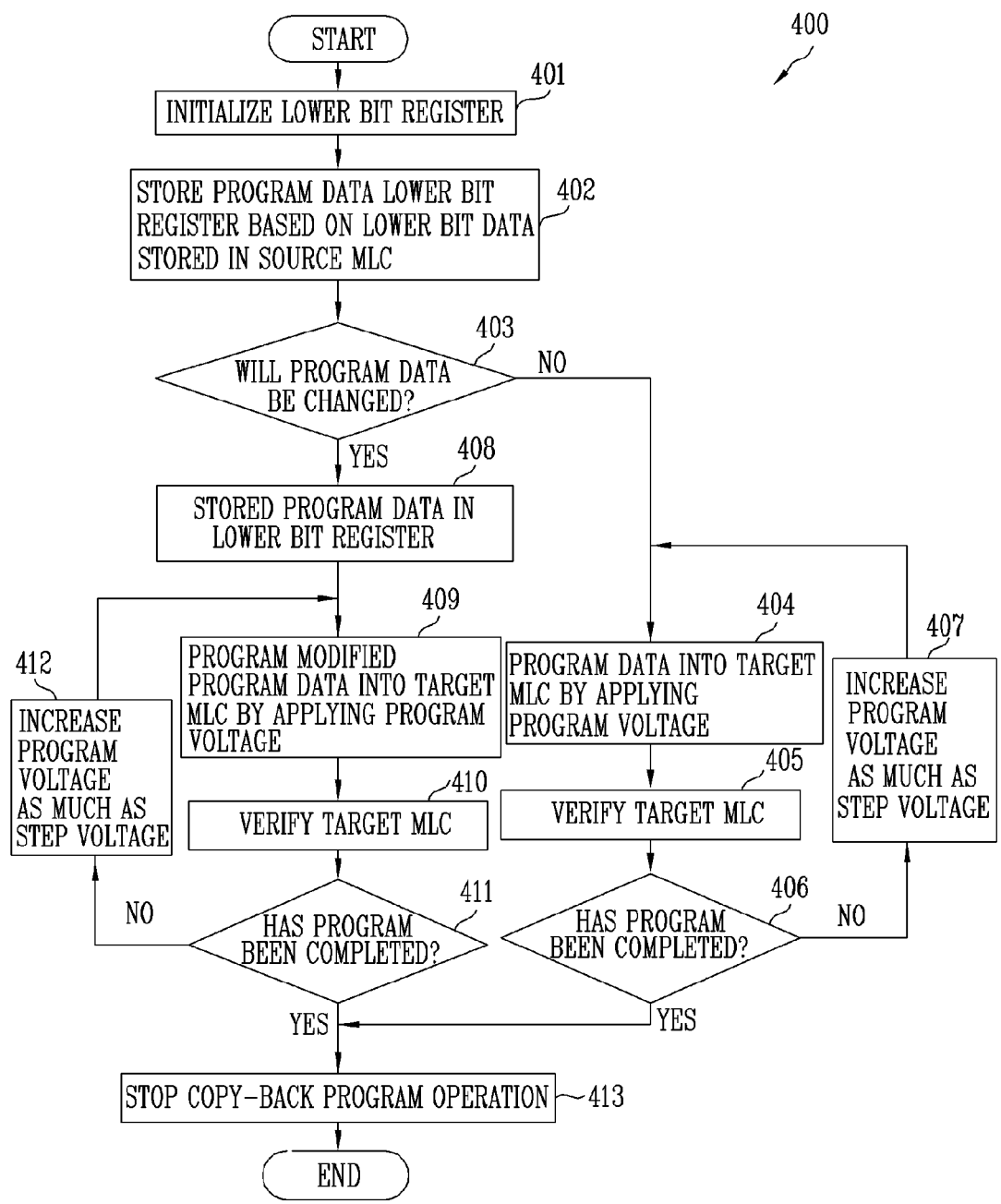
FIG. 2 is a flowchart illustrating a copy-back operation of the flash memory device according to an embodiment of the present invention.
Figure 3:
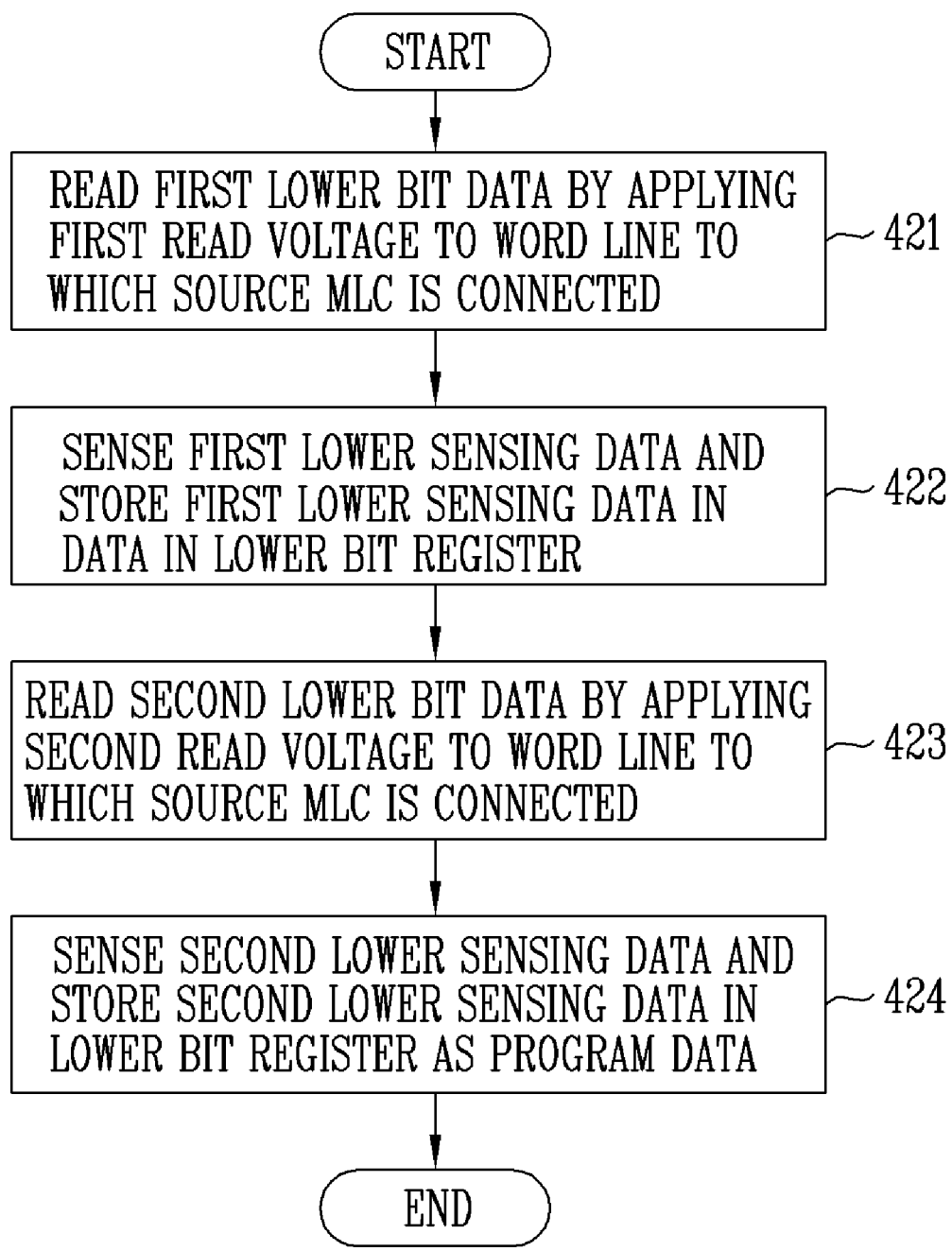
FIG. 3 is a flowchart illustrating, in detail, the step (402) shown in FIG. 2 according to an embodiment of the present invention.
Figure 4:
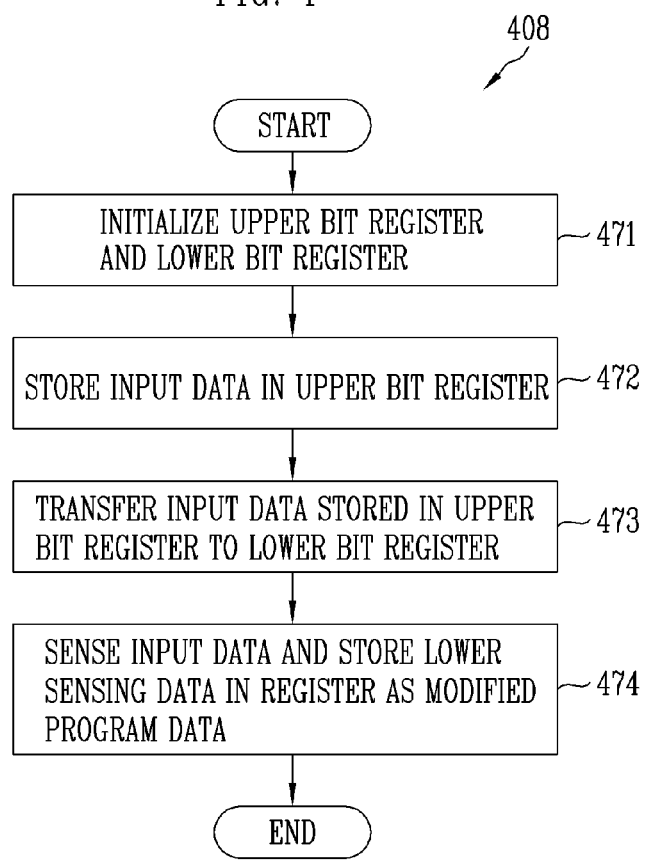
FIG. 4 is a flowchart illustrating, in detail, the step (407) shown in FIG. 2 according to an embodiment of the present invention.
Figure 6:
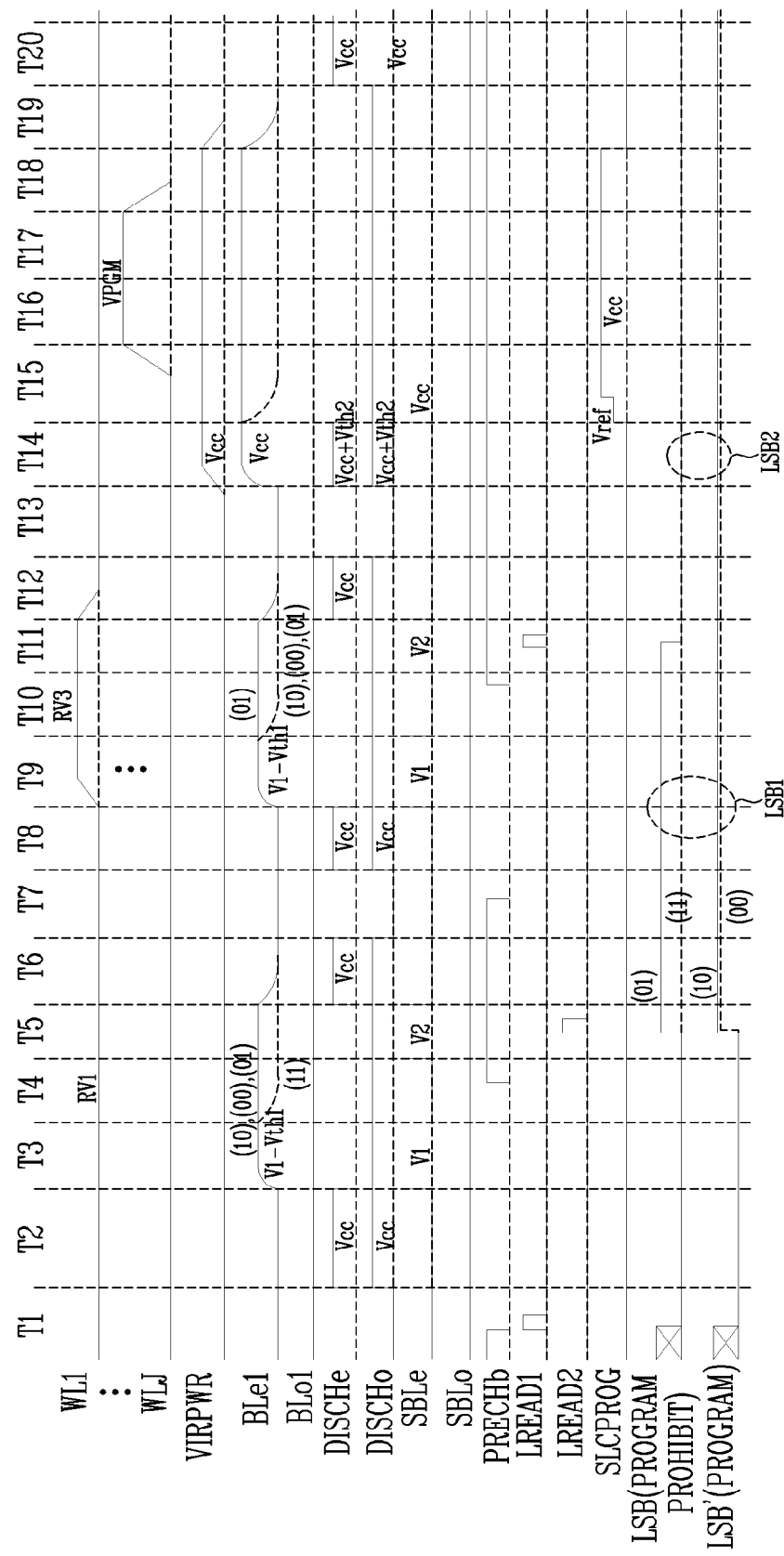
FIG. 6 is a timing diagram of signals related to the copy-back operation of the flash memory device shown in FIG. 2 according to an embodiment of the present invention.

FIGS. 2 to 4 are flowcharts illustrating the copy-back operation of the flash memory device according to an embodiment of the present invention. FIG. 6 is a timing diagram of signals related to the copy-back operation of the flash memory device shown in FIG. 2.

Referring to FIGS. 2 and 6, during a period (T1), the lower bit register 240 is initialized in response to the first lower read control signal (LREAD1) (401). In more detail, during the period (T1), the precharge control signal (PRECHb) is disabled. The precharge circuit 220 precharges the sensing node SO with the internal voltage (VDD) in response to the precharge control signal (PRECHb). The first lower read control signal (LREAD1) is enabled for a predetermined time.

As a result, the sensing circuit 241 of the lower bit register 240 senses the voltage (VDD) of the sensing node SO in response to the first lower read control signal (LREAD1) and generates the lower sensing data (LSB) of a ground voltage (VSS) level (i.e., a logic level "0") to the node Q2*b*. Accordingly, the latch circuit 246 of the lower bit register 240 latches the lower sensing data (LSB) of the logic level "0" and is thus initialized.

Thereafter, during periods (T2 to T11), first and second lower bit data (RLD1, RLD2) (not shown) are sequentially read from the source MLCs (Me11 to Me1K) of the source page PG1 by sequentially supplying read voltages (RV1, RV2) (refer to FIG. 5) to the word line WL1. Program data (not shown) are stored in the lower bit register 240 on the basis of the first and second lower bit data (RLD1, RLD2) (402). The step (402) will be described below in more detail with reference to FIG. 3.

Figure 5:
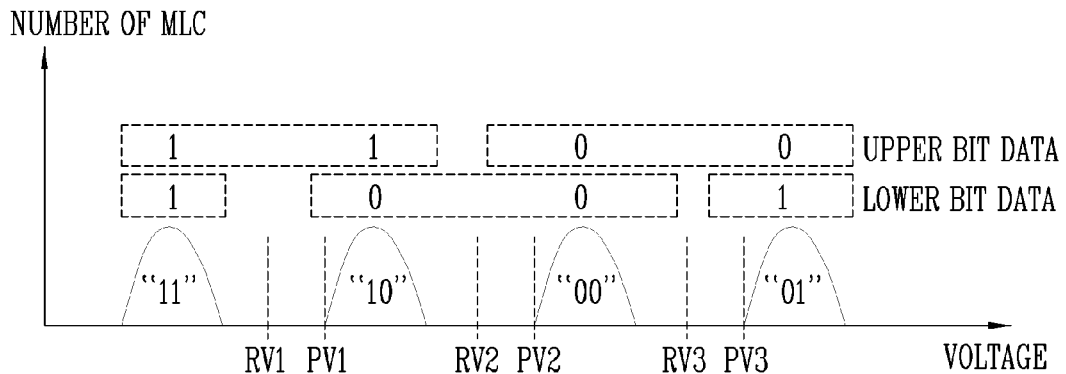
FIG. 5 is a view illustrating variation in threshold voltage distributions of MLCs depending on the copy-back operation of the flash memory device according to an embodiment of the present invention.

As the read voltage (RV1) is applied to the word line WL1 to which the source MLCs (Me11 to Me1K) are connected, the first lower bit data (RLD1) are read from the source MLCs (Me11 to Me1K) (421). In this case, the read voltage (RV1) may exist between a threshold voltage of erased MLCs (i.e., MLCs in which data "11" are stored) and a threshold voltage of MLCs in which data "10" are stored as shown in FIG. 5.

In more detail, during the period (T2), the discharge signals (DISCHe, DISCHo) are enabled and the precharge control signal (PRECHb) is disabled. Preferably, the discharge signals (DISCHe, DISCHo) may become the voltage (Vcc) level. As a result, the precharge circuit 220 precharges the sensing node SO with the internal voltage (VDD). The bit line select circuit 210 discharges the bit lines BLe1 to BLeK, BLo1 to BLoK with a voltage (i.e., the ground voltage) level of a bit line control signal (VIRPWR).

Thereafter, during a period (T3), the bit line select signal (SBLe) is enabled and the bit line select signal (SBLo) is disabled. Furthermore, the discharge signal (DISCHe) is disabled and the discharge signal (DISCHo) keeps disabled. The bit line select circuit 210 connects the bit line BLe1 to the sensing node SO and separates the bit line BLo1 from the sensing node SO, in response to the bit line select signals (SBLe, SBLo) and the discharge signals (DISCHe, DISCHo). Consequently, the bit line BLe1 is percharged to a voltage (V1−Vth1) (where Vth1 is a threshold voltage of the NMOS transistor 213) level by means of the voltage (VDD) of the precharged sensing node SO. The voltage (V1) may be set lower than the voltage (VDD). Meanwhile, the bit line BLo1 remains discharged (i.e., a ground voltage state).

During a period (T4), the bit line select signal (SBLe) is disabled and the precharge control signal (PRECHb) is enabled. The bit line select circuit 210 separates the bit line BLe1 from the sensing node SO and the precharge circuit 220 stops the precharge operation of the sensing node SO. If the source MLCs (Me11 to Me1K) have already been programmed (i.e., data values "10", "00" and "01" have been stored in the source MLCs (Me11 to Me1K), the bit line BLe1 is kept to the voltage (V1−Vth1) level during the period (T4). On the other hand, if the source MLCs (Me11 to Me1K) have not been programmed (i.e., a case where they have data "11"), the voltage level of the bit line BLe1 gradually lowers and then becomes the ground voltage level during the period (T4).

During a period (T5), the bit line select signal (SBLe) is enabled and the second lower read control signal (LREAD2) is enabled for a predetermined time. As a result, the bit line BLe1 is connected to the sensing node SO, and the voltage of the sensing node SO is changed to the ground voltage or kept to the voltage (VDD) level according to a voltage level (i.e., a logic value of the first lower bit data (RLD1)) of the bit line BLe1.

Furthermore, the sensing circuit 241 of the lower bit register 240 senses a voltage of the sensing node SO. First lower sensing data (LSB1) (i.e., the sensing result) is stored in the lower bit register 240 (422). For example, in the case where data value "11" have been stored in the source MLC (Me11), the first lower sensing data (LSB1) of logic level "0" are generated to the node Q2*b* of the lower bit register 240 (i.e., the first lower sensing data (LSB1) is kept to a data value of an initialized state). On the other hand, in the case where one of data values "10", "00" and "01" has been stored in the source MLC (Me11), the first lower sensing data (LSB1) of logic level "1" are generated to the node Q2*b* of the lower bit register 240.

During a period (T9), as read voltage (RV3) is applied to the word line WL1 to which the source MLCs (Me11 to Me1K) are connected, the second lower bit data (RLD2) are read from the source MLCs (Me11 to Me1K) (423). At this time, the read voltage (RV3) may exist between a threshold voltage of MLCs in which data value "00" is stored and a threshold voltage of MLCs in which data value "01" is stored as shown in FIG. 5. Accordingly, the read voltage (RV3) is higher than the read voltage (RV1). The step (423) is similar to the step (421). Detailed description thereof will be omitted.

During a period (T10), the bit line select circuit 210 separates the bit line BLe1 from the sensing node SO, and the precharge circuit 220 stops the precharge operation of the sensing node SO. If data "01" are stored in the source MLCs (Mell to Me1K), the bit line BLe1 is kept to the voltage (V1−Vth1) level during the period (T10). On the other hand, if one of data values "11", "10" and "00" are stored in the source MLCs (Mell to Me1K), the voltage level of the bit line BLe1 gradually lowers and then becomes the ground voltage level during the period (T10).

Thereafter, during a period (T11), the bit line select signal (SBLe) is enabled and the first lower read control signal (LREAD1) is enabled for a predetermined time. As a result, the sensing circuit 241 senses a voltage of the sensing node SO and the second lower sensing data (LSB2) (i.e., the sensing result) is stored in the lower bit register 240 as program data (424). The reason why the lower bit data stored in the source MLCs (Mell to Me1K) are read twice for the copyback operation is to accurately read the lower bit data stored in the source MLCs (Mell to Me1K).

Through such a twice read operation, it is possible to know whether data stored in the source MLCs (Mell to Me1K) is one of "11" and "01" or one of "10" and "00". For example, in the case where one of data "11" and "01" is stored in the source MLC (Mell), the second lower sensing data (LSB2) of logic level "0" is generated in the node Q2b of the lower bit register 240. In the case where one of data "10" and "00" is stored in the source MLC (Mell), the second lower sensing data (LSB2) of logic level "1" is generated in the node Q2b of the lower bit register 240.

Referring back to FIG. 2, it is then determined whether the program data will be changed (403). If it is determined that the program data will not be changed in step (403), program data (i.e., LS) are programmed into the target MLC (MeJ1) in response to the first program control signal (SLCPROG) (404).

In more detail, as shown in FIG. 6, during a period (T14), the discharge signals (DISCHe, DISCHo) are enabled to become a voltage (Vcc+Vth2) level and the bit line control signal (VIRPWR) is enabled to become the voltage (Vcc) level. As a result, the bit line select circuit 210 precharges the bit lines BLe1, BLo1 with the voltage (Vcc) level of the bit line control signal (VIRPWR) in response to the discharge signals (DISCHe, DISCHo).

Thereafter, during periods (T15 to T18), the discharge signal (DISCHe) is disabled and the discharge signal (DISCHo) remains enabled. Furthermore, the word line WLJ to which the target MLC (MeJ1) is connected is supplied with a program voltage (VPGM), and the bit line select signal (SBLe) and the first program control signal (SLCPROG) is enabled. As a result, the bit line select circuit 210 connects the bit line BLe1 to the sensing node SO. The second switch 280 outputs program data (i.e., the inversed second lower sensing data (LS)), which is received from the lower bit register 240, to the sensing node SO. At this time, when the inversed second lower sensing data (LS) have a logic level "0" (i.e., when the second lower sensing data (LSB) have logic level "1"), the target MLC (MeJ1) is programmed. Meanwhile, when the inversed second lower sensing data (LS) has a logic level "1" (i.e., when the second lower sensing data (LSB) has a logic level "0"), the program of the target MLC (MeJ1) is prohibited.

In this case, when the target MLCs (MeJ1 to MeJK) connected to the bit lines BLe1 to BLeK are programmed at the same time, a current (a peak current) that flows from the bit lines BLe1 to BLeK to the ground through the first switch 280 of each of the page buffers PB1 to PBK and the inverter 247 of each of the page buffers PB1 to PBK abruptly rises. The current that has risen as described above generates a voltage drop in the inverter 247 and raises the ground voltage level of the flash memory device. If the ground voltage of the flash memory device rises as described above, a problem arises because the flash memory device malfunctions.

Accordingly, to prevent the ground voltage from rising, the bit line select signal (SBLe) and the first program control signal (SLCPROG) may be set so that they are enabled with a reference voltage (Vref) level lower than the power supply voltage (Vcc) during the periods (T15 to T18). Therefore, an abrupt rise in the current, which is incurred by a lowered current driving capability of the second switch 280 and the NMOS transistor 213, can be prevented. At this time, the inverter 247 may be implemented using a COMS inverter having a PMOS transistor and a NMOS transistor which are connected in series between the power supply voltage and the ground voltage.

During a period (T20), the discharge signals (DISCHe, DISCHo) are enabled to become the voltage (Vcc) level and the bit line control signal (VIRPWR) is disabled to become the ground voltage level. Consequently, the bit line select circuit 210 discharges the bit lines BLe1, BLo1 to the ground voltage level of the bit line control signal (VIRPWR) in response to the discharge signals (DISCHe, DISCHo).

Thereafter, though not shown in FIG. 6, it is determined whether the program of the target MLCs has been completed by applying a verify voltage (PV1) higher than the read voltage (RV1) to the word line WLJ to which the target MLCs (MeJ1 to MeJK) are connected (405, 406). If it is determined that the program of the target MLCs (MeJ1 to MeJK) has not been completed, the program voltage (VPGM) rises to a step voltage (407) and the process then return to the step (404). The step voltage may be generally set to 0.5V, more preferably to 0.3V or less.

Thereafter, the steps (407, 404 to 406) are repeatedly performed until the program of the target MLCs (MeJ1 to MeJK) is completed. In this case, whether the program of the target MLCs (MeJ1 to MeJK) has been completed can be determined according to a value of the lower verify data (LVD1 to LVDK) generated by the verify circuit 302 of each of the page buffers PB1 to PBK. This operation is well known to those skilled in the art. Therefore, description thereof will be omitted.

Meanwhile, if it is determined that the program data will be modified in step (403), modified program data is stored in the lower bit register 240 (408). For example, a case where program data stored in some of the page buffers PB1 to PBK should be modified may be taken into consideration. The step (408) will be described below in more detail with reference to FIG. 4.

The upper bit register 230 is initialized in response to the upper read control signal (MREAD) and the lower bit register 240 is initialized in response to the second lower read control signal (LREAD2) (471). The input data (D1B or D2) are stored in the upper bit register 230 in response to the data input signals (DI, nDI) (472). The first switch 270 transfers the input data (D1 or D2) to the lower bit register 240 through the sensing node SO in response to the data transfer signal (DTRANS) (473). As a result, the lower bit register 240 senses the input data (D1 or D2) in response to the first lower read control signal (LREAD1) and stores the lower sensing data (LSB) as modified program data (not shown) (474).

Referring again to FIG. 2, the modified program data (i.e., LS) are programmed into the target MLC (MeJ1) in response to the first program control signal (SLCPROG) (409). The step (409) is substantially the same as the step (404). Therefore, description thereof will be omitted.

In the same manner as the step (405), it is then determined whether the program of the target MLCs (MeJ1 to MeJK) has been completed. If it is determined that the program of the target MLCs (MeJ1 to MeJK) has not been completed, the program voltage (VPGM) rises as much as the step voltage (412) and the step (409) is then again executed. At this time, the step voltage may be generally set to 0.5V, more preferably 0.3V or less. The steps (412, 409 to 411) are then repeatedly executed until the program of the target MLCs (MeJ1 to MeJK) is completed. Furthermore, in the steps (406, 411), if it is determined that the program of the target MLCs (MeJ1 to MeJK) has been completed, the copy-back program operation is stopped (413).

The copy-back operation of the flash memory device according to another embodiment of the present invention will be described in more detail with reference to FIGS. 1 and 5, and FIGS. 7 to 14. For convenience of description, in the present embodiment, a case where data stored in the MLCs (Me11 to Me1K) (i.e., source MLCs) of the page PG1 are copy-back programmed into the MLCs (MeJ1 to MeJK) (i.e., target MLCs) of the page PGJ will be described as an example. Furthermore, only the operation of the page buffer PB1 will be described as an example.

Figure 7:
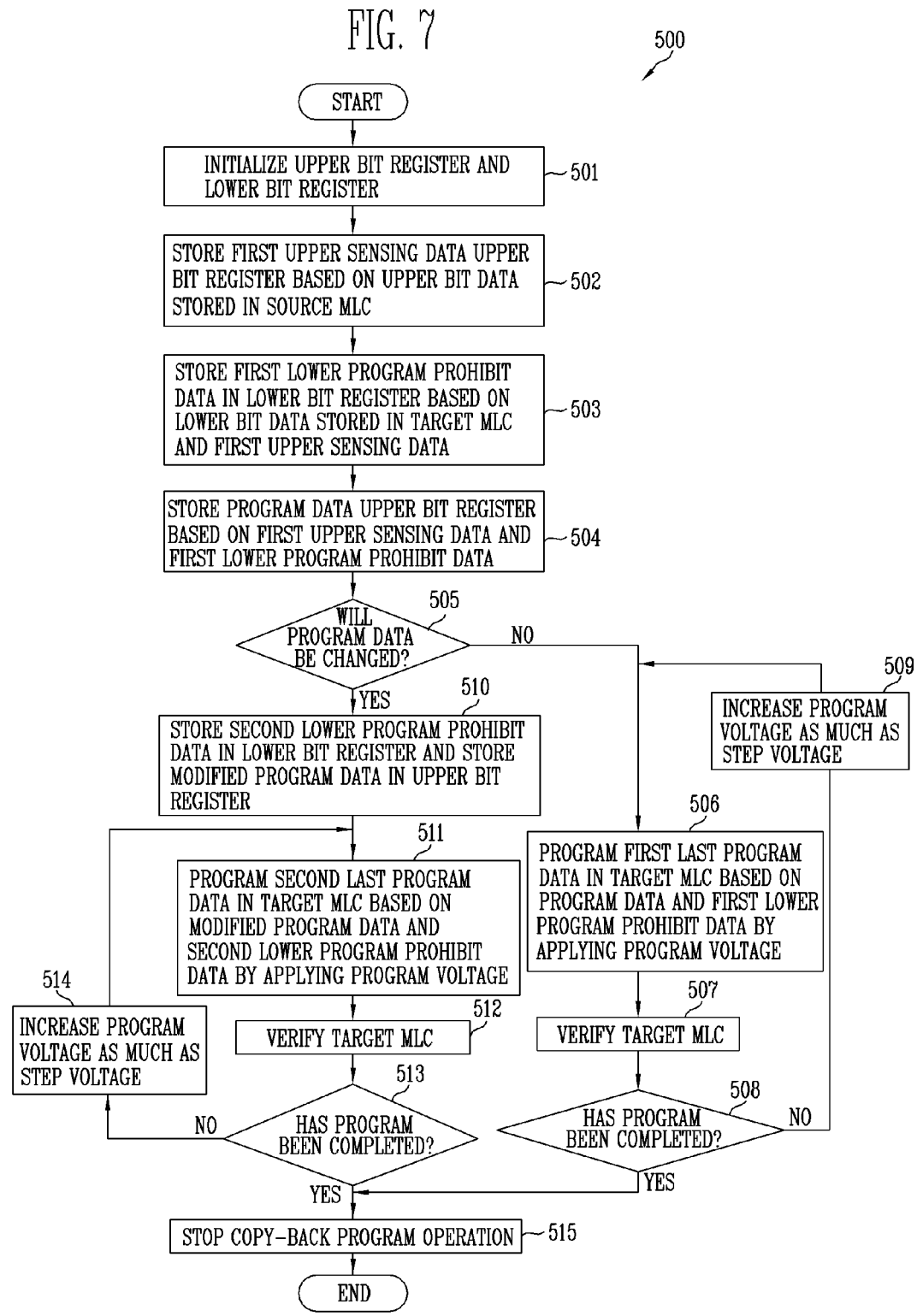
FIG. 7 is a flowchart illustrating a copy-back operation of a flash memory device according to another embodiment of the present invention.
Figure 8:
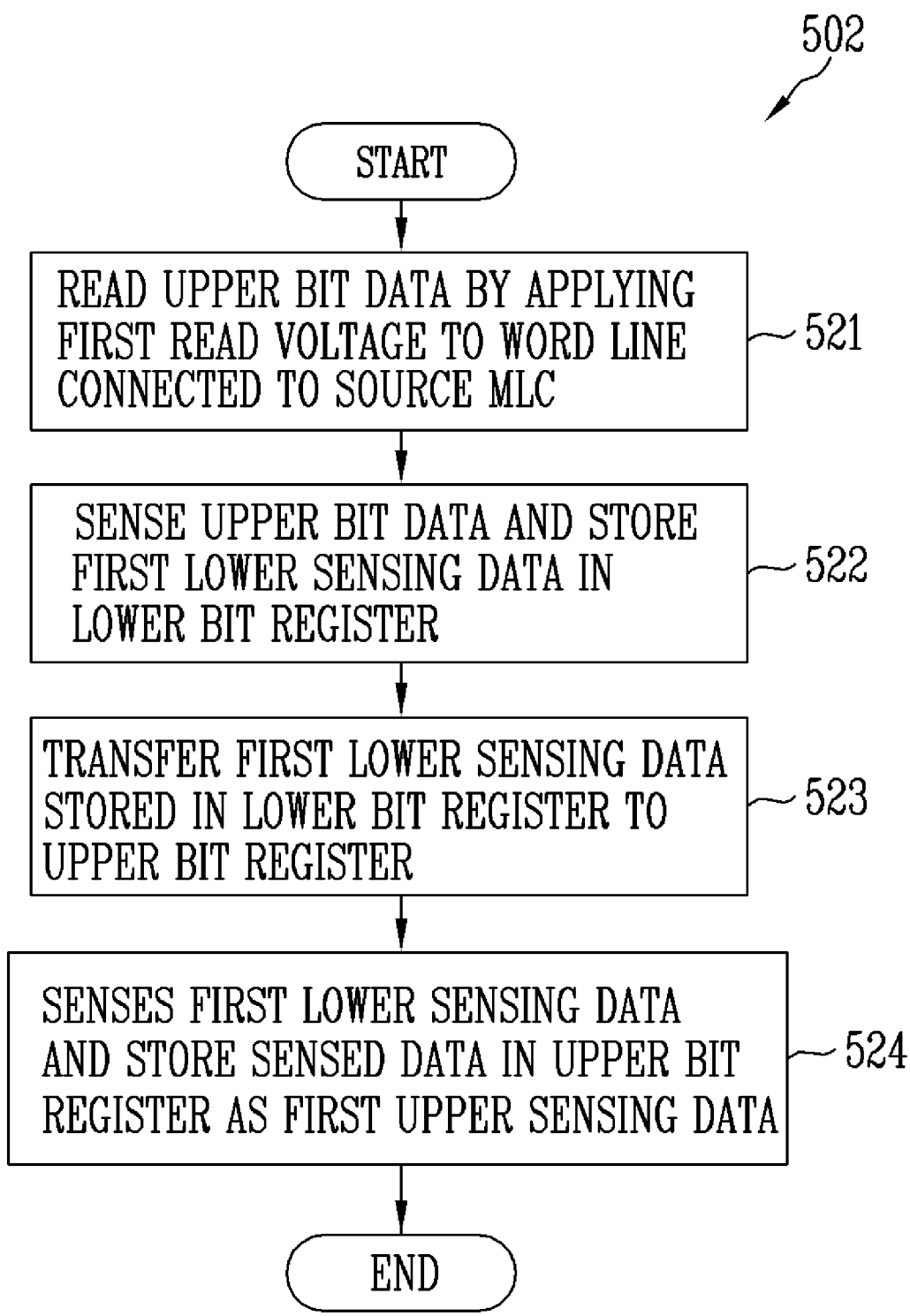
FIG. 8 is a flowchart illustrating, in detail, the step (502) shown in FIG. 7 according to an embodiment of the present invention.

Referring to FIG. 7, in step 501, the upper bit register 230 is initialized in response to the reset control signal (MSBSET) and the lower bit register 240 is initialized in response to the first lower read control signal (LREAD1). This will be described in more detail with reference to FIG. 14.

During a period (P1), the precharge control signal (PRECHb) is disabled, and the reset control signal (MSBSET) and the first lower read control signal (LREAD1) are enabled for a predetermined time. The precharge circuit 220 precharges the sensing node SO with the internal voltage (VDD) in response to the precharge control signal (PRECHb). Furthermore, the latch reset circuit 233 of the upper bit register 230 discharges the node Q1 with the ground voltage (VSS) level in response to the reset control signal (MSBSET). Consequently, the latch circuit 232 of the upper bit register 230 is initialized.

Furthermore, the sensing circuit 241 of the lower bit register 240 senses the voltage (VDD) of the sensing node SO in response to the first lower read control signal (LREAD1), and generates the ground voltage (VSS) level (i.e., the lower sensing data (LSB) of logic level "0") in the node Q2b. Accordingly, the latch circuit 246 of the lower bit register 240 is initialized by latching the lower sensing data (LSB) of logic level "0".

Thereafter, as the read voltage (RV2) is applied to the word line WL1 to which the source MLCs (Me11 to Me1K) are connected, upper bit data (RMD1 to RMDK) stored in the source MLCs (Me11 to Me1K) are read. First upper sensing data (not shown) is stored in the upper bit register 230 of each of the page buffers PB1 to PBK based on the read upper bit data (RMD1 to RMDK) (502). This will be described in more detail with reference to FIG. 8.

During a period (P2), the bit lines BLe1, BLo1 are discharged with the ground voltage level of the bit line control signal (VIRPWR). During periods (P3 and P4), the word line WL1 is supplied with the read voltage (RV2). As a result, the upper bit data (RMD1 to RMDK) are read (521). At this time, if data values "00" or "01" have been stored in the source MLCs (Me11 to Me1K), the bit line BLe1 is kept to the voltage (V1–Vth1) level during the period (P4). On the other hand, if data values "11" or "10" have been stored in the source MLCs (Me11 to Me1K), the voltage level of the bit line BLe1 gradually decreases and then becomes the ground voltage level during the period (P4). The step (521) is the same as the step (421) except for the read voltage (RV2) applied to the word line WL1.

Furthermore, during a period (P5), the lower bit register 240 senses upper bit data in response to the second lower read control signal (LREAD2) and stores the first lower sensing data (LS) (i.e., the sensing result) (522). For example, in the case where data values "00" or "01" are stored in the source MLCs (Me11 to Me1K), the first lower sensing data (LSB 1) of logic level "1" is generated in the node Q2b of the lower bit register 240. On the other hand, in the case where data values "11" or "10" are stored in the source MLCs (Me11 to Me1K), the first lower sensing data (LSB1) of logic level "0" is generated in the node Q2b of the lower bit register 240 (i.e., the node Q2b is kept to a data value of an initialized state). The step 522 is similar to the above-mentioned step (422).

Thereafter, the second switch 280 transfers the inverted first lower sensing data (LS), which are received from the lower bit register 240, to the upper bit register 230 through the sensing node SO in response to the first program control signal (SLCPROG) (523). Furthermore, the upper bit register 230 senses the first lower sensing data (LS) in response to the upper read control signal (MREAD) and stores the sensed first lower sensing data (LS) as first upper sensing data (MSB1) (not shown) (524).

The steps (523, 524) will be described below in more detail. During a period (P6), the precharge control signal (PRECHb) is disabled. As a result, the sensing node SO is percharged with the internal voltage (VDD). During a period (P7), each of the upper read control signal (MREAD) and the first program control signal (SLCPROG) is enabled for a predetermined time. Consequently, the second switch 280 transfers the inverted first lower sensing data (LS) to the upper bit register 230 through the sensing node SO. Furthermore, the sensing circuit 231 of the upper bit register 230 senses the first lower sensing data (LS) in response to the upper read control signal (MREAD) and generates the first upper sensing data (MSB 1) in the node Q1b.

For example, when the inverted first lower sensing data (LS) is logic level "1" (i.e., when the first lower sensing data (LSB1) is logic level "0"), the sensing circuit 231 generates the first upper sensing data (MSB1) of logic level "0" in the node Q1b. Meanwhile, when the inverted first lower sensing data (LS) is logic level "0" (i.e., when the first lower sensing data (LSB1) is logic level "1"), the first upper sensing data (MSB1) of logic level "1" is generated in the node Q1b (i.e., the node Q1b is kept to a data value of an initialized state).

Referring back to FIG. 7, as the read voltage (RV1) is applied to the word line WLJ to which the target MLCs (MeJ1 to MeJK) are connected, the upper bit data (RMD1 to RMDK) are read from the target MLCs (MeJ1 to MeJK). First lower program prohibit data (not shown) are stored in the lower bit register 240 of each of the page buffers PB1 to PBK based on the read upper bit data (RMD1 to RMDK) and the first upper sensing data (MSB1 to MSBK) (503).

Figure 9:
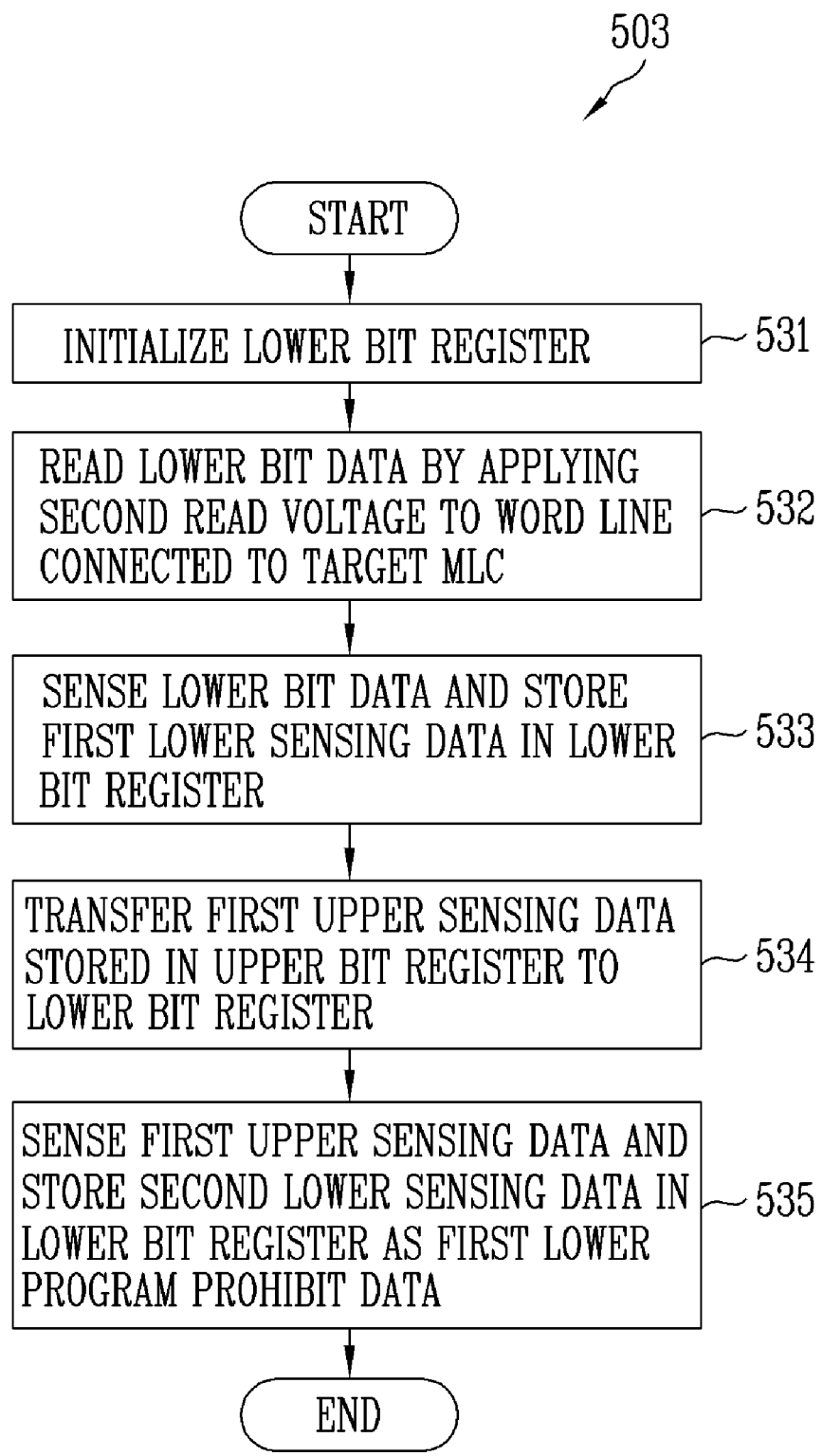
FIG. 9 is a flowchart illustrating, in detail, the step (503) shown in FIG. 7 according to an embodiment of the present invention.

The step 503 will be described in more detail with reference to FIG. 9. During a period (P7), as the second lower read control signal (LREAD2) is enabled for a predetermined time, the lower bit register 240 is initialized in response to the second lower read control signal (LREAD2) (531).

During a period (P8), the bit lines BLe1, BLo1 are discharged with the ground voltage level. During a period (P9), the word line WLJ is supplied with the read voltage (RV1). As a result, the lower bit data (RLD1 to RLDK) are read from the target MLCs (MeJ1 to MeJK) (532).

During a period (P11), the first lower read control signal (LREAD1) is enabled for a predetermined time. The lower bit registers 240 of the page buffers PB1 to PBK sense the lower bit data (RLD1 to RLDK), respectively, in response to the first lower read control signal (LREAD1) and stores the first lower sensing data (LSB1) (533). For example, when data values "10" is stored in the target MLCs (MeJ1 to MeJK), the first lower sensing data (LSB1) of logic level "0" is generated in the node Q2b of the lower bit register 240. On the other hand, when data value "11" is stored in the target MLCs (MeJ1 to MeJK), the first lower sensing data (LSB1) of logic level "1" is generated in the node Q2b of the lower bit register 240 (i.e., the node Q2b is kept to a data value of an initialized state).

Thereafter, during a period (P12), the first switch 270 transfers the first upper sensing data (MS1), which are stored in the upper bit register 230, to the lower bit register 240 through the sensing node SO in response to the data transfer signal (DTRANS) (534). Furthermore, during the period (P12), the lower bit register 240 senses the first upper sensing data (MS1) in response to the first lower read control signal (LREAD1) and stores the second lower sensing data (LSB2) (i.e., the sensing result) as the first lower program prohibit data (535).

For example, when the first upper sensing data (MS1) is logic level "1", the second lower sensing data (LSB2) of logic level "0" is generated in the node Q2b. On the other hand, when the first upper sensing data (MS1) is logic level "0", the second lower sensing data (LSB2) of logic level "1" is generated in the node Q2b (i.e., the node Q2b is kept to a data value of an initialized state). Referring back to FIG. 7, program data (not shown) are generated and are then stored in the upper bit register 230 based on the first upper sensing data (MS1) and the first lower program prohibit data (504).

Figure 10:
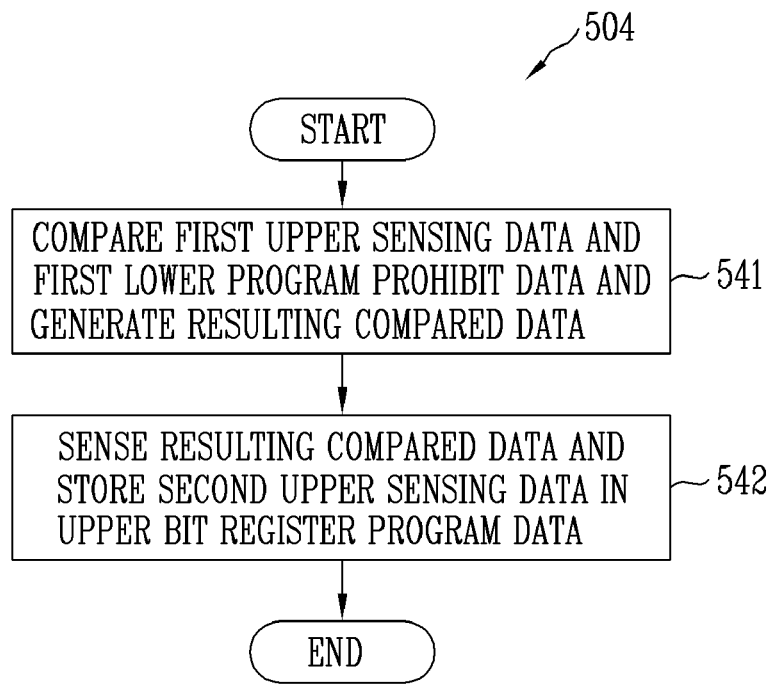
FIG. 10 is a flowchart illustrating, in detail, the step (504) shown in FIG. 7 according to an embodiment of the present invention.
Figure 11:
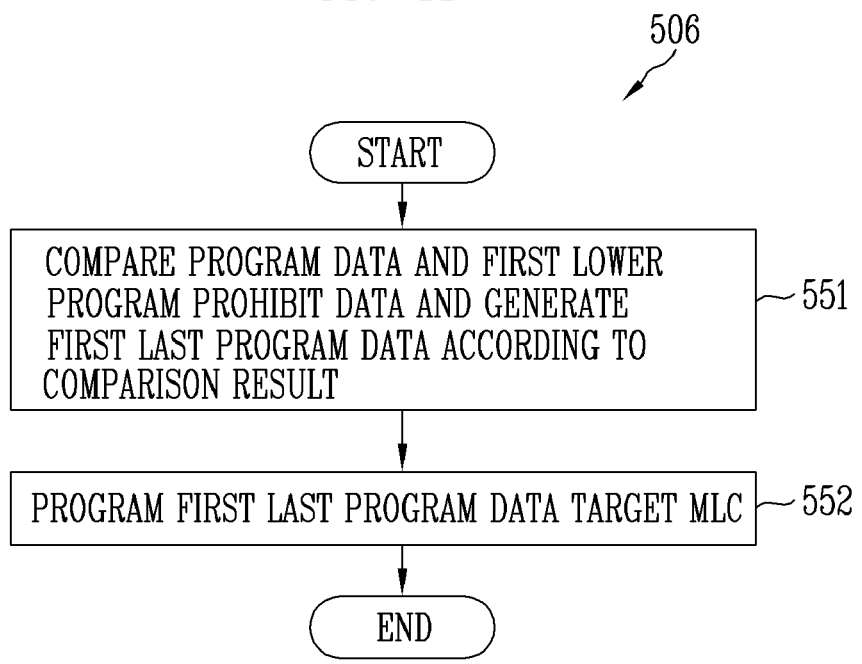
FIG. 11 is a flowchart illustrating, in detail, the step (506) shown in FIG. 7 according to an embodiment of the present invention.
Figure 12:
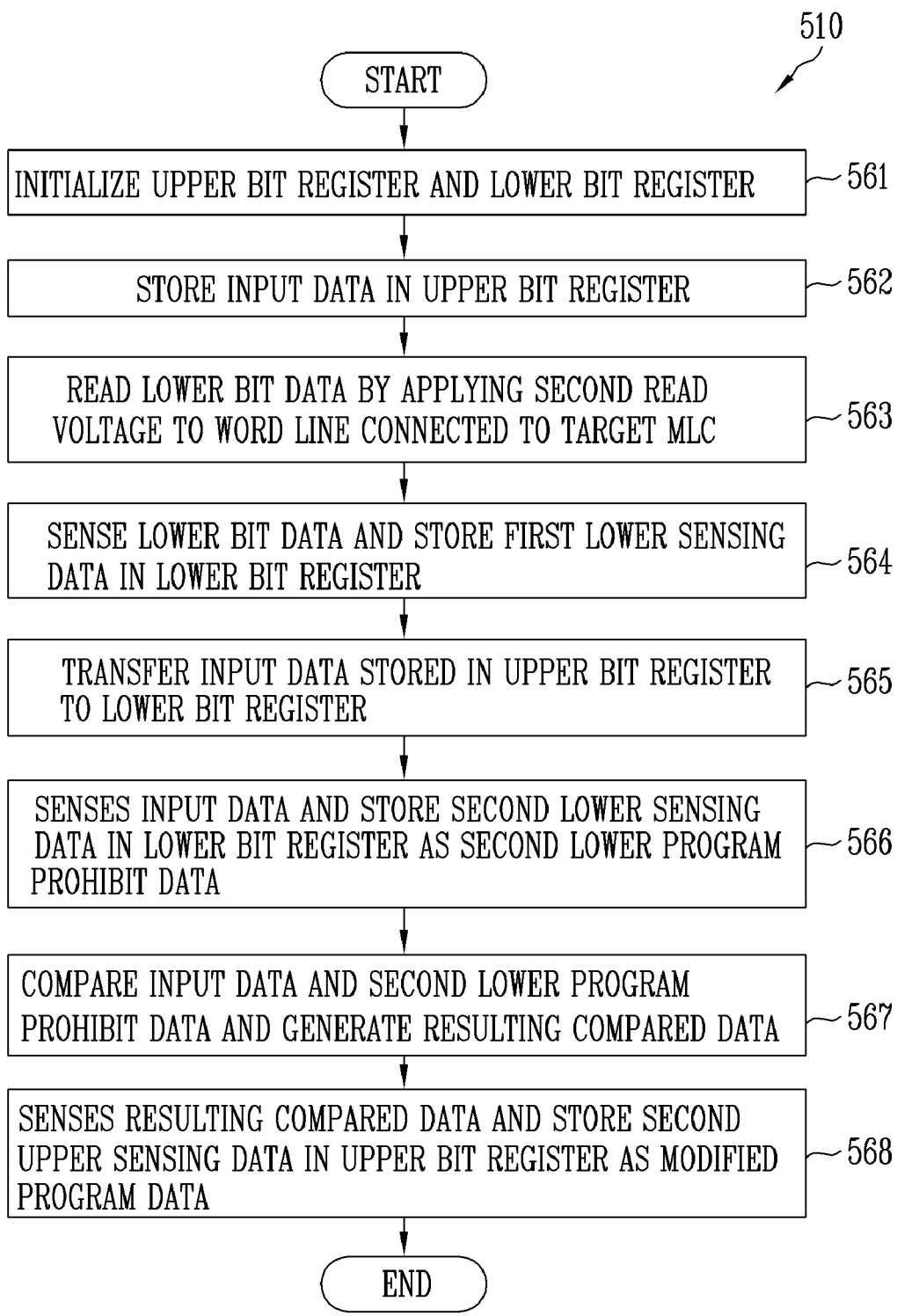
FIG. 12 is a flowchart illustrating, in detail, the step (510) shown in FIG. 7 according to an embodiment of the present invention.
Figure 13:
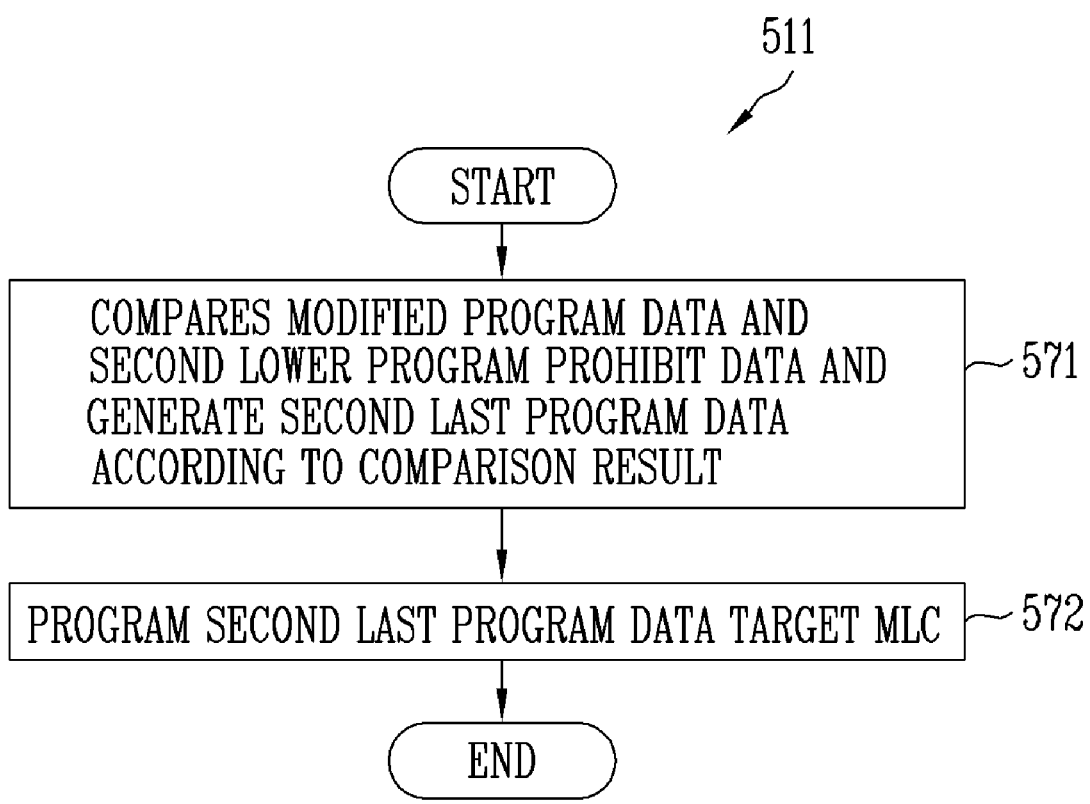
FIG. 13 is a flowchart illustrating, in detail, the step (511) shown in FIG. 7 according to an embodiment of the present invention.

The step 504 will be described below in more detail with reference to FIG. 10. During a period (P13), the second program control signal (MLCPROG) is enabled for a predetermined time. The compare circuit 250 compares the first upper sensing data (MS1), which are received through the node N1, and the first lower program prohibit data), which are received through the node N2, in response to the second program control signal (MLCPROG), and generates the resulting compared data (CM) to the sensing node SO as the comparison result (541). In this case, logic values of the resulting compared data (CM) depending on logic levels of the nodes N1, N2 can be expressed in the following table.

TABLE 1

| N1 | N2 | CM (SO node) |
|---|---|---|
| 0 | 0 | Hi-Z (high impedance state) |
| 0 | 1 | 0 |
| 1 | 0 | 0 |
| 1 | 1 | 1 |

Thereafter, during a period (P14), the upper read control signal (MREAD) is enabled for a predetermined time. As a result, the upper bit register 230 senses the resulting compared data (CM) in response to the upper read control signal (MREAD) and stores the second upper sensing data (MSB2) as the program data (542).

Referring back to FIG. 7, it is determined whether the program data will be changed (505). If it is determined that the program data will not be changed, first last program data are generated based on the program data and the first lower program prohibit data and the first last program data are programmed into the target MLCs (MeJ1 to MeJK) (506). The step (506) will be described below in more detail with reference to FIG. 11.

During a period (P15), the discharge signals (DISCHe, DISCHo) are enabled with the voltage (Vcc+Vth2) level and the bit line control signal (VIRPWR), resulting in the voltage (Vcc) level. As a result, the bit line select circuit 210 precharges the bit lines BLe1, BLo1 with the voltage (Vcc) level of the bit line control signal (VIRPWR) in response to the discharge signals (DISCHe, DISCHo).

Thereafter, during periods (P16 to T20), the discharge signal (DISCHe) is disabled and the discharge signal (DISCHo) keeps enabled. Furthermore, the word line WLJ to which the target MLC (MeJ1) is connected is supplied with the program voltage (VPGM), and the bit line select signal (SBLe) and the second program control signal (MLCPROG) are enabled. As a result, the bit line select circuit 210 connects the bit line BLe1 to the sensing node SO in response to the bit line select signal (SBLe).

The compare circuit 250 compares the program data and the first lower program prohibit data in response to the second program control signal (MLCPROG) and generates first last program data (FPD1) in the sensing node SO according to the comparison result (551). Consequently, the first last program data (FPD1) are programmed into the target MLC (MeJ1) (552).

In this case, the logic value of the first last program data (FPD1) and the program state of the target MLC (MeJ1) according to the logic levels of the nodes N1, N2 (i.e., the logic values of the program data and the first lower program prohibit data) can be expressed in the following table.

TABLE 2

| N1 | N2 | FPD1 | Program state of target MLC |
|---|---|---|---|
| 0 | 0 | Hi-Z (high impedance state) | Program prohibit |
| 0 | 1 | 0 | "00" data program |
| 1 | 0 | 0 | "01" data program |
| 1 | 1 | 1 | Program prohibit |

In this case, when the target MLCs (MeJ1 to MeJK) connected to the bit lines BLe1 to BLeK are programmed at the same time, a current (a peak current) that flows from the bit lines BLe1 to BLeK to the ground through the compare circuit 250 of each of the page buffers PB1 to PBK and the inverter 237 or 247 of each of the page buffers PB1 to PBK abruptly rises. The current that has risen as described above generates a voltage drop in the inverter 237 or 247 and raises the ground voltage level of the flash memory device. If the ground voltage of the flash memory device rises as described above, a problem arises because the flash memory device malfunctions.

Accordingly, to prevent the ground voltage from rising, the bit line select signal (SBLe) and the second program control signal (MLCPROG) may be set so that they are enabled with a reference voltage (Vref) level lower than the power supply voltage (Vcc) during the periods (P16 to P20). Therefore, an abrupt rise in the current, which is incurred by a lowered current driving capability of the NMOS transistors 213, 251 and 253, can be prevented. At this time, the inverter 237 or 247 may be implemented using a COMS inverter having a PMOS transistor and a NMOS transistor which are connected in series between the power supply voltage and the ground voltage.

Referring back to FIG. 7, during a period (P21), the discharge signals (DISCHe, DISCHo) are enabled to become the voltage (Vcc) level and the bit line control signal (VIRPWR) is disabled to become the ground voltage level. Consequently, the bit line select circuit 210 discharges the bit lines BLe1, BLo1 to the ground voltage level of the bit line control signal (VIRPWR) in response to the discharge signals (DISCHe, DISCHo).

Thereafter, thought not shown in FIG. 14, it is determined whether the program of the target MLCs has been completed by applying a verify voltage (PV2) (refer to FIG. 5), which is higher than the read voltage (RV2), to the word line WLJ to which the target MLCs (MeJ1 to MeJK) are connected (507, 508). If it is determined that the program of the target MLCs (MeJ1 to MeJK) has not been completed, the program voltage (VPGM) rises to a step voltage (509) and the process then return to the step (506). The step voltage may be generally set to 0.5V, more preferably 0.3V or less.

Thereafter, the steps (509, 506 to 508) are repeatedly performed until the program of the target MLCs (MeJ1 to MeJK) is completed. In this case, whether the program of the target MLCs (MeJ1 to MeJK) has been completed can be determined according to a value of the upper verify data (MVD1 to MVDK) generated by the verify circuit 301 of each of the page buffers PB1 to PBK. This operation is well known to those skilled in the art. Therefore, description thereof will be omitted.

Meanwhile, if it is determined that the program data will be modified in step (505), second lower program prohibit data are stored in the lower bit register 240 and modified program data are stored in the upper bit register 203 (510). For example, a case where program data stored in some of the page buffers PB1 to PBK should be modified may be taken into consideration. The step (510) will be described below in more detail with reference to FIG. 12. The upper bit register 230 is initialized in response to the upper read control signal (MREAD) and the lower bit register 240 is initialized in response to the second lower read control signal (LREAD2) (561). The input data (DIB or D2) are stored in the upper bit register 230 in response to the data input signals (DI, nDI) (562).

Thereafter, in the same manner as the above-mentioned step (532), as the read voltage (RV1) is applied to the word line WLJ, the lower bit data (RLD1 to RLDK) are read from the target MLCs (MeJ1 to MeJK) (563). Furthermore, in the same manner as the above-mentioned step (533), the lower bit registers 240 of the page buffers PB1 to PBK sense the lower bit data (RLD1 to RLDK), respectively, in response to the first lower read control signal (LREAD1) and store the first lower sensing data (LSB1) (564).

Thereafter, in the same manner as the above-mentioned step (534), the first switch 270 transfers the input data (D1B or D2), which are stored in the upper bit register 230, to the lower bit register 240 through the sensing node SO in response to the data transfer signal (DTRANS) (565). Furthermore, in the same manner as the above-mentioned step (535), the lower bit register 240 senses the input data (D1B or D2) in response to the first lower read control signal (LREAD1) and stores the second lower sensing data (LSB2), which are the sensing result, as the second lower program prohibit data (566).

In the same manner as the above-mentioned step (541), the compare circuit 250 compares the input data (D1B or D2), which are received through the node N1, and the second lower program prohibit data, which are received through the node N2, in response to the second program control signal (MLCPROG), and generates the resulting compared data (CM) to the sensing node SO as the sensing result (567).

In this case, the logic value of the resulting compared data (CM) according to the logic level of the nodes N1, N2 is similar to that in Table 1. Thereafter, in the same manner as the above-mentioned step (542), the upper bit register 230 senses the resulting compared data (CM) in response to the upper read control signal (MREAD) and stores the second upper sensing data (MSB2) as modified program data (568).

Referring back to FIG. 7, in the same manner as the step (506), the second last program data (FPD2) is generated based on the modified program data and the second lower program prohibit data. The second last program data are programmed into the target MLCs (MeJ1 to MeJK) (511). The step 511 will be described below in more detail with reference to FIG. 13.

In the same manner as the step (551), the compare circuit 250 compares the modified program data and the second lower program prohibit data in response to the second program control signal (MLCPROG) and generates the second last program data (FPD2) to the sensing node SO according to the comparison result (571). As a result, the second last program data (FPD2) are programmed into the target MLC (MeJ1) (572). In this case, the logic value of the second last program data (FPD2) and the program state of the target MLC (MeJ1) depending on the logic levels of the nodes N1, N2 (i.e., the logic values of the modified program data and the second lower program prohibit data) is similar to those in Table 2.

Thereafter, whether the program of the target MLC has been completed is determined by applying the verify voltage (PV2) higher than the read voltage (RV2) to the word line WLJ to which the target MLCs (MeJ1 to MeJK) are connected (512, 513). If it is determined that the program of the target MLCs (MeJ1 to MeJK) has not been completed, the program voltage (VPGM) rises as much as the step voltage (514) and the step (511) is then executed. In this case, the step voltage may be generally set to 0.5V, more preferably 0.3V or less. Thereafter, the steps (514, 511 to 513) are repeatedly executed until the program of the target MLCs (MeJ1 to MeJK) is completed.

Furthermore, in the same manner as the above-mentioned steps (551, 552), in the steps (571, 572), the bit line select signal (SBLe) and the second program control signal (MLCPROG) may be set with a reference voltage (Vref) level lower than the power supply voltage (Vcc) in order to prevent the ground voltage level from rising, which is caused by an abrupt rise of a peak current, which flows through the compare circuit 250 and the inverter 237 or 247 during the program operation.

As described above, according to the present invention, in a flash memory device including MLCs, the copy-back operation can be executed even without an additional storage space. Furthermore, according to the present invention, a program time can be shortened and operational performance of a flash memory device can be improved.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of controlling a copy-back operation of a flash memory device including a plurality of Multi-Level Cells (MLCs) connected to bit lines and word lines, the method comprising the steps of:

initializing an upper bit register in response to a reset control signal and initializing a lower bit register in response to a first lower read control signal;

reading upper bit data from a source MLC of the plurality of MLCs by applying a first read voltage to a word line to which the source MLC is connected, and storing first upper sensing data in the upper bit register based on the read upper bit data;

reading lower bit data from a target MLC of the plurality of MLCs by applying a second read voltage to a word line to which the target MLC is connected, and storing first lower program prohibit data in the lower bit register based on the read lower bit data and the first upper sensing data;

generating program data based on the first upper sensing data and the first lower program prohibit data and storing the program data in the upper bit register;

determining whether the program data will be modified;

if it is determined that the program data will not be modified, generating first last program data based on the program data and the first lower program prohibit data, and firstly programming the first last program data into the target MLC;

if it is determined that the program data will be modified, storing second lower program prohibit data in the lower bit register and storing modified program data in the upper bit register; and generating second last program data based on the modified program data and the second lower program prohibit data, and secondly programming the second last program data in the target MLC.

2. The method as claimed in claim 1, wherein the first read voltage is higher than the second read voltage.

3. The method as claimed in claim 1, further comprising the steps of:
after the first program step,
determining whether the program of the target MLC has been completed by applying a verify voltage to the word line to which the target MLC is connected; and
repeatedly executing the first program step and the verify step until the program of the target MLC is completed,
wherein a program voltage applied to the word line to which the target MLC is connected in the first program step executed after the verify step is higher than a program voltage applied to the word line to which the target MLC is connected in the first program step executed before the verify step as much as a step voltage.

4. The method as claimed in claim 3, wherein the step voltage is 0.3V or less.

5. The method as claimed in claim 1, further comprising the steps of:
after the second program step,
determining whether the program of the target MLC has been completed by applying a verify voltage to the word line to which the target MLC is connected; and
repeatedly executing the second program step and the verify step until the program of the target MLC is completed,
wherein a program voltage applied to the word line to which the target MLC is connected in the second program step executed after the verify step is higher than a program voltage applied to the word line to which the target MLC is connected in the second program step executed before the verify step as much as a step voltage.

6. The method as claimed in claim 5, wherein the step voltage is 0.3V or less.

7. The method as claimed in claim 1, wherein the step of storing the first upper sensing data in the upper bit register comprises the steps of:
reading the upper bit data from the source MLC by applying the first read voltage to a word line to which the source MLC is connected;
sensing the upper bit data in response to the second lower read control signal and storing the first lower sensing data in the lower bit register;
transferring the first lower sensing data to the upper bit register through a sensing node in response to a first program control signal; and
sensing the first lower sensing data in response to an upper read control signal and storing the sensed data in the upper bit register as the first upper sensing data.

8. The method as claimed in claim 1, wherein the step of storing the first lower program prohibit data in the lower bit register comprises the steps of:
initializing the lower bit register in response to a second lower read control signal;
reading lower bit data from the target MLC by applying the second read voltage to a word line to which the target MLC is connected;
sensing the lower bit data in response to the first lower read control signal and storing first lower sensing data in the lower bit register;
transferring the first upper sensing data to the lower bit register through a sensing node in response to a data transfer signal; and
sensing the first upper sensing data in response to the first lower read control signal and storing second lower sensing data in the lower bit register as the first lower program prohibit data.

9. The method as claimed in claim 1, wherein the step of storing the program data in the upper bit register comprises the steps of:
comparing the first upper sensing data and the first lower program prohibit data in response to a second program control signal and generating the resulting compared data to the sensing node as the comparison result; and
sensing the resulting compared data in response to an upper read control signal and storing second upper sensing data in the upper bit register as the program data.

10. The method as claimed in claim 1, wherein the first program step comprises the steps of:
comparing the program data and the first lower program prohibit data in response to a second program control signal and generating the first last program data according to the comparison result; and
programming the first last program data into the target MLC.

11. The method as claimed in claim 10, wherein the second program control signal has a reference voltage level lower than an internal voltage.

12. The method as claimed in claim 1, wherein the step of storing the second lower program prohibit data in the lower bit register and the modified program data in the upper bit register comprises the steps of:
initializing the upper bit register in response to an upper read control signal and initializing the lower bit register in response to a second lower read control signal;
storing input data in the upper bit register in response to data input signals;
reading the lower bit data from the target MLC by applying the second read voltage to a word line to which the target MLC is connected;
sensing the lower bit data in response to the first lower read control signal and storing first lower sensing data in the lower bit register;
transferring the input data to the lower bit register through a sensing node in response to a data transfer signal;

sensing the input data in response to the first lower read control signal and storing second lower sensing data in the lower bit register as the second lower program prohibit data;

comparing the input data and the second lower program prohibit data in response to a second program control signal and generating the resulting compared data to the sensing node as the comparison result; and sensing the resulting compared data in response to the upper read control signal and storing second upper sensing data in the upper bit register as the modified program data.

13. The method as claimed in claim 1, wherein the second program step comprises the steps of:

comparing the modified program data and the second lower program prohibit data in response to a second program control signal and generating the second last program data to the sensing node according to the comparison result; and programming the second last program data in the target MLC.

14. The method as claimed in claim 13, wherein the second program control signal has a reference voltage level lower than an internal voltage.

* * * * *